(12) United States Patent
Kwon et al.

(10) Patent No.: US 12,402,494 B2
(45) Date of Patent: *Aug. 26, 2025

(54) ORGANIC LIGHT-EMITTING DISPLAY DEVICE HAVING REDUCED COMPENSATED STEP FROM ELECTRODE LINES TO PREVENT CRACKING OF ENCAPSULATION LAYER

(71) Applicant: Samsung Display Co., LTD., Yongin-si (KR)

(72) Inventors: Sun-Ja Kwon, Gunpo-si (KR); Won-Kyu Kwak, Seongnam-si (KR); Kwang-Min Kim, Seoul (KR); Byoung-Sun Kim, Hwaseong-si (KR); Hye-Jin Shin, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 4 days.

This patent is subject to a terminal disclaimer.

(21) Appl. No.: 18/630,503

(22) Filed: Apr. 9, 2024

(65) Prior Publication Data

US 2024/0260339 A1 Aug. 1, 2024

Related U.S. Application Data

(63) Continuation of application No. 17/866,858, filed on Jul. 18, 2022, now Pat. No. 12,058,900, which is a
(Continued)

(30) Foreign Application Priority Data

Dec. 22, 2015 (KR) .......................... 10-2015-0183520

(51) Int. Cl.
*H10K 59/124* (2023.01)
*H10K 50/844* (2023.01)
(Continued)

(52) U.S. Cl.
CPC ....... *H10K 59/124* (2023.02); *H10K 50/8445* (2023.02); *H10K 59/1213* (2023.02);
(Continued)

(58) Field of Classification Search
CPC ............... H10K 59/124; H10K 59/131; H10K 59/1213; H10K 50/8445; H10K 59/8731; H10K 59/8051; H10K 59/8052
(Continued)

(56) References Cited

U.S. PATENT DOCUMENTS 8,415,676 B2   4/2013  Kim
10,714,553 B2  7/2020  Kwon et al.
(Continued)

FOREIGN PATENT DOCUMENTS

KR   10-2013-0005877   1/2013

*Primary Examiner* — Eric W Jones
(74) *Attorney, Agent, or Firm* — KILE PARK REED & HOUTTEMAN PLLC

(57) ABSTRACT

An organic light-emitting display device includes a substrate having a display region and a peripheral region, a plurality of pixels on the substrate in the display region, a first wiring and a second wiring on the substrate in the peripheral region, An insulation layer on the first and second wirings, the insulation layer covering a top surface and a sidewall of each of the first and second wirings, and an encapsulation layer on the plurality of pixels and on the insulation layer.

17 Claims, 5 Drawing Sheets

Related U.S. Application Data continuation of application No. 16/903,638, filed on Jun. 17, 2020, now Pat. No. 11,411,060, which is a continuation of application No. 15/386,526, filed on Dec. 21, 2016, now Pat. No. 10,714,553.

(51) Int. Cl.
*H10K 59/121* (2023.01)
*H10K 59/131* (2023.01)
*H10K 59/80* (2023.01)

(52) U.S. Cl.
CPC ....... *H10K 59/131* (2023.02); *H10K 59/8731* (2023.02); *H10K 59/8051* (2023.02); *H10K 59/8052* (2023.02)

(58) Field of Classification Search
USPC .............................................. 257/40, 59, 99
See application file for complete search history.

(56) References Cited

U.S. PATENT DOCUMENTS

| | | |
|---|---|---|
| 11,411,060 B2 | 8/2022 | Kwon et al. |
| 12,058,900 B2 * | 8/2024 | Kwon ................ H10K 59/8731 |
| 2007/0178796 A1 | 8/2007 | Kwak |
| 2008/0055212 A1 | 3/2008 | Kim |
| 2008/0135847 A1 | 6/2008 | Jung |
| 2013/0342429 A1 | 12/2013 | Choi et al. |
| 2014/0239270 A1 | 8/2014 | Ko et al. |
| 2014/0353625 A1 | 12/2014 | Yi et al. |
| 2015/0001497 A1 | 1/2015 | Jung et al. |
| 2015/0214504 A1 | 7/2015 | Sonoda et al. |

* cited by examiner

ORGANIC LIGHT-EMITTING DISPLAY DEVICE HAVING REDUCED COMPENSATED STEP FROM ELECTRODE LINES TO PREVENT CRACKING OF ENCAPSULATION LAYER

CROSS-REFERENCE TO RELATED APPLICATION

This is a continuation application of U.S. patent application Ser. No. 17/866,858 filed Jul. 18, 2022, which issues as U.S. Pat. No. 12,058,900 on Aug. 6, 2024, the disclosure of which is incorporated herein by reference in its entirety. U.S. patent application Ser. No. 17/866,858 is a continuation application of U.S. patent application Ser. No. 16/903,638 filed Jun. 17, 2020, now U.S. Pat. No. 11,411,060, issued Aug. 9, 2022, the disclosure of which is incorporated herein by reference in its entirety. U.S. patent application Ser. No. 16/903,638 is a continuation application of U.S. patent application Ser. No. 15/386,526, filed Dec. 21, 2016, now U.S. Pat. No. 10,714,553, issued Jul. 14, 2020. U.S. patent application Ser. No. 15/386,526 claims priority benefit of Korean Patent Application No. 10-2015-0183520, filed on Dec. 22, 2015 in the Korean Intellectual Property Office, the disclosure of which is incorporated herein by reference in its entirety for all purposes.

BACKGROUND

1. Field

Example embodiments relate to display devices. More particularly, example embodiments relate to organic light-emitting display devices including a compensation layer that compensates a stepped region derived from wirings.

2. Description of the Related Art

An organic light-emitting display device may have an organic light-emitting structure including a hole injection layer, an electron injection layer, and an organic light-emitting layer formed therebetween. In the organic light-emitting display device, light may be generated as excitons, that are the combination of holes injected from the hole injection layer and electrons injected from the electron injection layer, fall from an excited state to a ground state. The organic light-emitting display device may not require a separate light source, and thus the organic light-emitting display device may have a small thickness and a light weight, as well as low power consumption. Furthermore, the organic light-emitting display device may have a wide viewing angle, a high contrast, and a high response speed, etc.

However, the organic light-emitting structure may be easily degraded by vapor or oxygen from the outside. Therefore, an encapsulation member may be required to protect the organic light-emitting structure from the vapor or the oxygen. Recently, an encapsulation layer has been used as the encapsulation member for the organic light-emitting structure to make the organic light-emitting structure thin and flexible.

SUMMARY

According to an aspect of example embodiments, an organic light-emitting display device may include a substrate having a display region and a peripheral region, a plurality of pixels disposed on the substrate in the display region, a first wiring and a second wiring disposed on the substrate in the peripheral region, a compensation layer disposed on the first and second wirings, and an encapsulation layer disposed on the plurality of pixels and on the compensation layer. The compensation layer may surround a top surface and a sidewall of each of the first and second wirings.

In example embodiments, the compensation layer may compensate a stepped region derived from the first and second wirings.

In example embodiments, the first wiring may supply a driving voltage to the plurality of pixels, and the second wiring may supply a common voltage to the plurality of pixels.

In example embodiments, each of the plurality of pixels may include a pixel circuit having an active pattern, a gate electrode, an insulation interlayer, a source electrode and a drain electrode, and an organic light-emitting structure having a pixel electrode, an organic light-emitting layer and a common electrode. The organic light-emitting structure may be electrically connected to the pixel circuit.

In example embodiments, the first and second wirings, and the gate electrode may be disposed at substantially the same level over the substrate. The compensation layer and the insulation interlayer may be disposed at substantially the same level over the substrate.

In example embodiments, each of the plurality of pixels may further include an insulation layer disposed between the source and the drain electrodes, and the pixel electrode, and a pixel defining layer disposed on the insulation layer. The pixel defining layer may expose a portion of the pixel electrode.

In example embodiments, the encapsulation layer may include at least one organic layer and at least one inorganic layer.

In some example embodiments, the encapsulation layer may have a structure in which a first inorganic layer, an organic layer, and a second inorganic layer are stacked.

According to another aspect of example embodiments, an organic light-emitting display device may include a substrate having a display region and a peripheral region, a plurality of pixels disposed on the substrate in the display region, a first wiring and a second wiring disposed on the substrate in a peripheral region, an interwiring insulation layer surrounding a top surface and a sidewall of each of the first and second wirings, a third wiring disposed on the interwiring insulation layer, the third wiring being electrically connected to the first wiring, a fourth wiring disposed on the interwiring insulation layer, the fourth wiring being electrically connected to the second wiring, a compensation layer disposed on the third and fourth wirings, and an encapsulation layer disposed on the plurality of pixels and on the compensation layer. The compensation layer may surround a top surface and a sidewall of each of the third and fourth wirings.

In example embodiments, the compensation layer may compensate a stepped region derived from the third and fourth wirings.

In example embodiments, the first and the third wirings may supply a driving voltage to the plurality of pixels, and the second and the fourth wirings may supply a common voltage to the plurality of pixels.

In example embodiments, the interwiring insulation layer may have a first contact hole exposing the first wiring and a second contact hole exposing the second wiring. The third wiring may fill the first contact hole to be contacted to the first wiring, and the fourth wiring may fill the second contact hole to be contacted to the second wiring.

In example embodiments, each of the plurality of pixels may include a pixel circuit having an active pattern, a first gate electrode, a gate insulation layer, a second gate electrode, an insulation interlayer, a source electrode and a drain electrode, and an organic light-emitting structure having a pixel electrode, an organic light-emitting layer and a common electrode. The organic light-emitting structure may be electrically connected to the pixel circuit.

In example embodiments, the first and second wirings, and the first gate electrode may be disposed at substantially the same level over the substrate. The third and fourth wirings, and the second gate electrode may be disposed at substantially the same level over the substrate.

In example embodiments, the compensation layer and the insulation interlayer may be disposed at substantially the same level over the substrate. The interwiring insulation layer and the gate insulation layer may be disposed at substantially the same level over the substrate.

In example embodiments, each of the plurality of pixels may further include an insulation layer disposed between the source and the drain electrodes, and the pixel electrode, and a pixel defining layer disposed on the insulation layer. The pixel defining layer may expose a portion of the pixel electrode.

In example embodiments, the encapsulation layer may include at least one organic layer and at least one inorganic layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
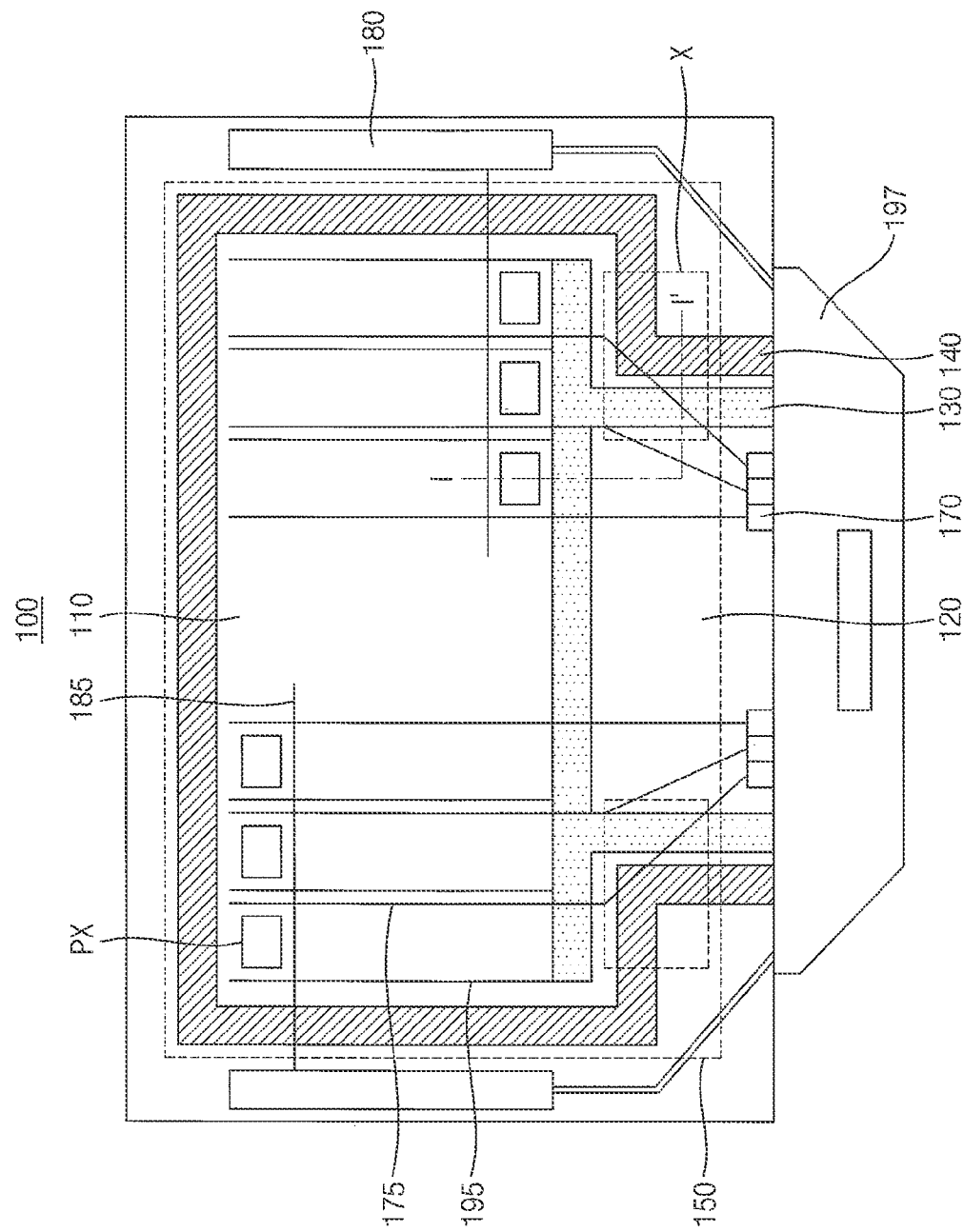
FIG. 1 illustrates a plan view of an organic light-emitting display device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, organic light-emitting display devices in accordance with example embodiments will be explained in detail with reference to the accompanying drawings.

Figure 2:
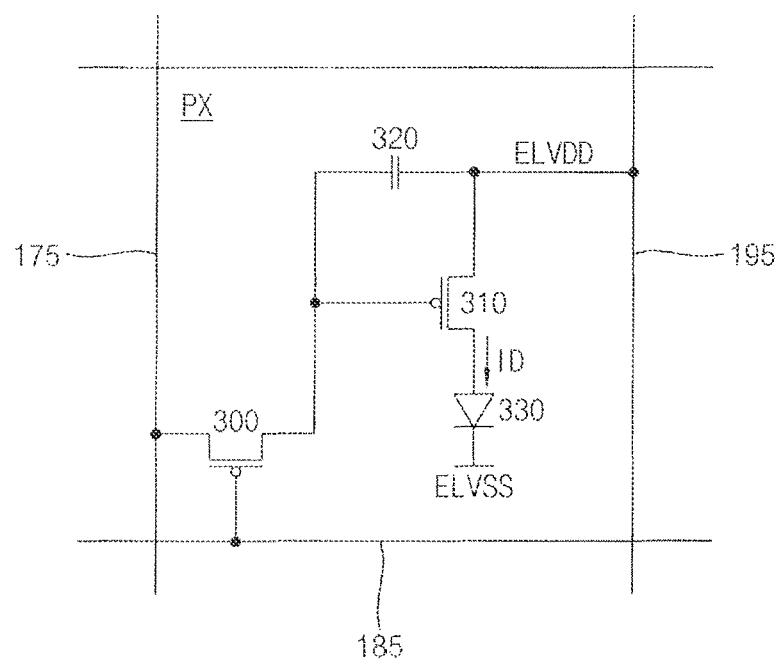
FIG. 2 illustrates a circuit diagram of a pixel of the organic light-emitting display device in FIG. 1.

FIG. 1 is a plan view illustrating an organic light-emitting display device in accordance with example embodiments. FIG. 2 is a circuit diagram illustrating a pixel of the organic light-emitting display device in FIG. 1.

Referring to FIG. 1, an organic light-emitting display device 100 may include a plurality of pixels PX, a first wiring part 130, a second wiring part 140, an encapsulation layer 150, a pad part 170, an embedded circuit part 180, etc. For example, the organic light-emitting display device 100 may have a display region 110 and a peripheral region 120.

An image may be displayed by the pixels PX in the display region 110 of the organic light-emitting display device 100. For example, the display region 110 may be substantially located on a center portion of the organic light-emitting display device 100.

A plurality of lines 175, 185 and 195 may be disposed in the display region 110. The lines 175, 185 and 195 may include a plurality of data lines 175 for transferring data signals to the pixels PX, a plurality of gate lines 185 for transferring gate signals (or scan signals) to the pixels PX, and a plurality of power voltage lines 195 for transferring a driving voltage ELVDD to the pixels PX, etc. The data lines 175 and the power voltage lines 195 may be substantially parallel to each other, and may extend along a first direction. The gate lines 185 may extend along a second direction substantially perpendicular to the first direction.

The plurality of pixels PX disposed in the display region 110 for displaying the image may be arranged as a substantial matrix structure.

Referring to FIG. 2, each pixel PX may include a pixel circuit and an organic light-emitting structure 330. The pixel circuit may include a switching transistor 300, a driving transistor 310, a capacitor 320, etc. FIG. 2 illustrates the pixel circuit having two transistors and one capacitor, however embodiments may not be limited thereto, e.g., the pixel circuit may include at least three transistors and/or at least two capacitors.

The switching transistor 300 may have a control electrode, an input electrode, and an output electrode. The control electrode may be connected to the gate line 185, the input electrode may be connected to the data line 175, and the output electrode may be connected to the driving transistor 310. The switching transistor 300 may transfer the data signal from the data line 175 to the driving transistor 310 based on the gate signal from the gate line 185.

The driving transistor 310 may have a control electrode, an input electrode, and an output electrode. The control electrode may be connected to the switching transistor 300, the input electrode may be connected to the power voltage line 195, and the output electrode may be connected to the organic light-emitting structure 330. The driving transistor 310 may transfer an output current ID to the organic light-emitting structure 330 based on a voltage between the control electrode and the output electrode.

The capacitor 320 may be connected between the control electrode and the input electrode of the driving transistor 310. The capacitor 320 may charge the data signal applied to the control electrode of the driving transistor 310, and the capacitor 320 may maintain the data signal after the switching transistor 300 is turned-off.

The organic light-emitting structure 330 may have an anode connected to the output electrode of the driving transistor 310 and a cathode receiving a common voltage ELVSS. The organic light-emitting structure 330 may emit light based on the output current ID from the driving transistor 310 to display an image.

Referring to FIG. 1 again, the image may not be displayed in the peripheral region 120 of the organic light-emitting display device 100. The peripheral region 120 may substantially surround the display region 110, and may be located in outer portion of the organic light-emitting display device 100.

The embedded circuit part 180 having a driver circuit for driving the pixels PX may be disposed in the peripheral region 120. The embedded circuit part 180 may include the driver circuit (e.g., a gate driver and/or a light emission control driver) for driving the pixels PX, and may further include an inspection circuit, etc. The embedded circuit part 180 may be located in both sides of the display region 110, however, the embedded circuit part 180 may be located in one side of the display region 110, alternatively.

The pad part 170 may be disposed in the peripheral region 120. Various signals (e.g., the data signal) may be applied to the pad part 170 from an external device, and a flexible printed circuit 197, on which integrated circuits are mounted, may be electrically connected to the pad part 170.

The first wiring part 130 and the second wiring part 140 may be disposed in the peripheral region 120. The first wiring part 130 may be located at one side of the organic light-emitting display device 100. The second wiring part 140 may be located to surround the display region 110.

One side of the first wiring part 130 may be connected to the flexible printed circuit 197. Another side of the first wiring part 130 may be connected to the power voltage lines 195. The first wiring part 130 may transfer the driving voltage ELVDD from the flexible printed circuit 197 to the power voltage lines 195.

The second wiring part 140 may be connected to the flexible printed circuit 197. The second wiring part 140 may transfer the common voltage ELVSS from the flexible printed circuit 197 to the pixels PX.

The encapsulation layer 150 may be, e.g., continuously, disposed over the pixels PX, over the first wiring part 130, and over the second wiring part 140. The encapsulation layer 150 may block vapor or oxygen from outside to protect the pixels PX, the first wiring part 130, and the second wiring part 140.

Figure 4:
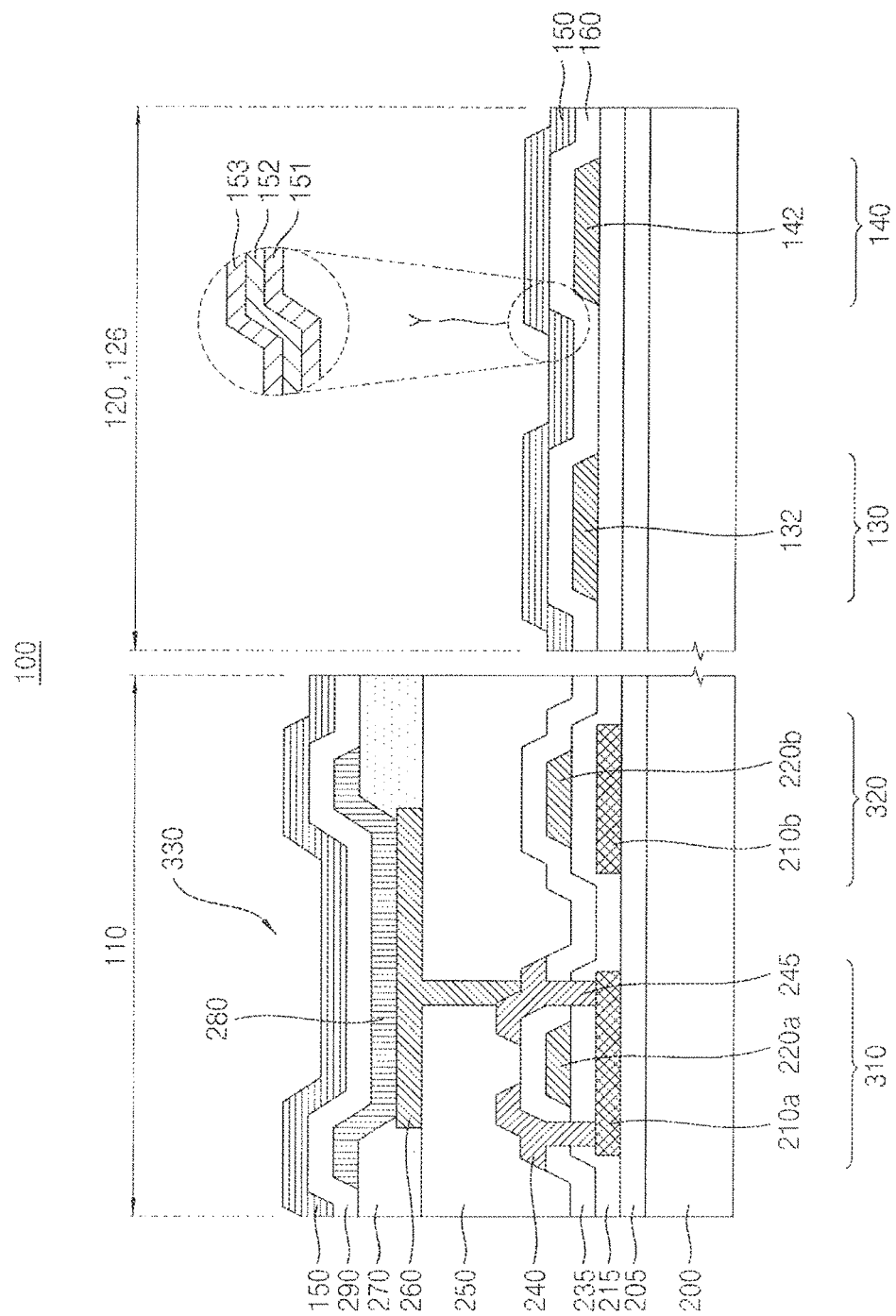
FIG. 4 illustrates a cross-sectional view along line I-I' of FIG. 1.

In example embodiments, the encapsulation layer 150 may include at least one organic layer and at least one inorganic layer. For example, the encapsulation layer 150 may include at least two inorganic layers and at least one organic layer. In this case, the organic layer may be disposed between the inorganic layers. In other words, the encapsulation layer 150 may have a structure in which a first inorganic layer 151 in FIG. 4, an organic layer 152 in FIG. 4, and a second inorganic layer 153 in FIG. 4 are sequentially stacked. For example, the inorganic layer may include at least one of aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$) and/or zinc oxide ($ZnO_x$). Furthermore, the organic layer may include epoxy, polyimide (PI), polyethylene terephthalate (PET), polycarbonate (PC), polyethylene (PE) and/or polyacrylate. The inorganic layer(s) may block permeation of oxygen or vapor, and the organic layer may provide flexibility to the organic light-emitting display device 100.

Figure 3:
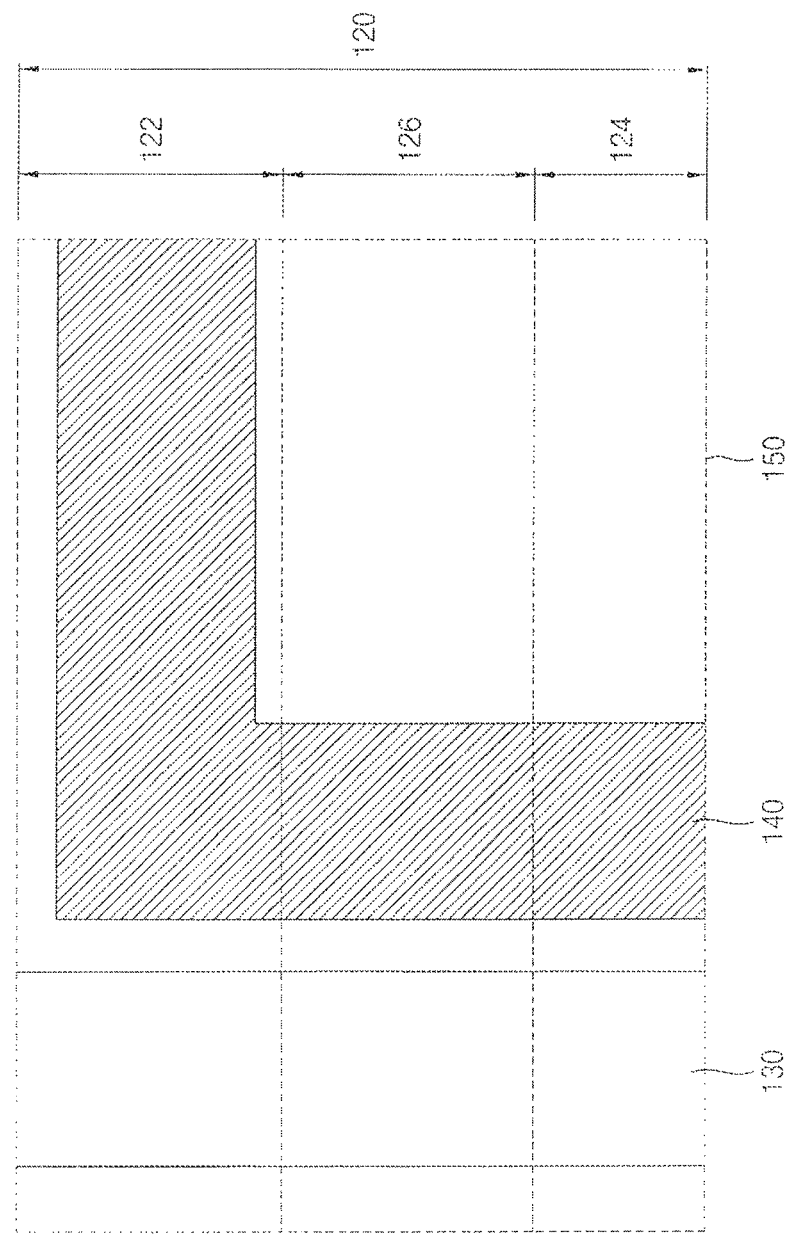
FIG. 3 illustrates a plan view of a portion 'X' of the organic light-emitting display device in FIG. 1.

FIG. 3 is a plan view illustrating an enlarged portion 'X' of the organic light-emitting display device in FIG. 1.

Referring to FIGS. 1 and 3, the peripheral region 120 may include a first sub-region 122, a second sub-region 124, and a third sub-region 126. The first sub-region 122 may be located adjacent to the display region 110. The second sub-region 124 may be located adjacent to the flexible printed circuit 197, e.g., most remote from the display region 110 among the first through third sub-regions 122 through 126. The third sub-region 126 may be located between the first sub-region 122 and the second sub-region 124.

In example embodiments, organic insulation layers (e.g., an insulation layer and a pixel defining layer) may be disposed between the first and second wiring parts 130 and 140, and the encapsulation layer 150. When the organic insulation layers are disposed in the entirety of the display region 110 and the peripheral region 120, vapor or oxygen may permeate from outside to the peripheral region 120 to pass through the organic insulation layer into the display region 110. In this case, the vapor or oxygen may contact the pixels PX disposed in the display region 110, so that the organic light-emitting structure 330 may be degraded.

Therefore, according to embodiments, a portion of the organic insulation layer in the third sub-region 126 of the peripheral region 120 may be removed to prevent above mentioned degradation of the organic light-emitting structure 330. Therefore, an inflow path of the vapor or oxygen from outside to the organic light-emitting structure 330 may be blocked, so that the degradation of the organic light-emitting structure 330 may be prevented. This will be described in more detail below with reference to FIG. 4.

FIG. 4 is a cross-sectional view along line I-I' in FIG. 1. For example, the right side of FIG. 4 illustrates the horizontal part of line I-I' (crossing elements 130 and 140 in the peripheral region 120), and the left side of FIG. 4 illustrates the vertical part of line I-I' (crossing the pixel PX in the display region 110).

Referring to FIG. 4, the organic light-emitting display device 100 may include a substrate 200, a pixel circuit, the first wiring part 130, the second wiring part 140, a compensation layer 160, the organic light-emitting structure 330, the encapsulation layer 150, etc. In example embodiments, the first wiring part 130 may include a first wiring 132, and the second wiring part 140 may include a second wiring 142. The organic light-emitting structure 330 may include a pixel electrode 260, an organic light-emitting layer 280, and a common electrode 290, etc.

The pixel circuit may include the driving transistor 310 and the capacitor 320. The pixel circuit may further include the switching transistor of FIG. 2 (not illustrated in FIG. 4 for convenience). For example, each of the driving transistor 310 and the switching transistor may correspond to a thin film transistor. The driving transistor 310 may include a first active pattern 210a, a first gate electrode 220a, a source electrode 240, and a drain electrode 245. The capacitor 320 may include a second active pattern 210b and a second gate electrode 220b.

For example, the substrate 200 may include a transparent substrate, e.g., a glass substrate, a quartz substrate, a transparent plastic substrate, etc. In another example, the substrate 200 may include a flexible substrate.

A buffer layer 205 may be disposed on the substrate 200. The buffer layer 205 may extend from the display region 110 to the peripheral region 120. The buffer layer 205 may prevent a diffusion of impurities generated from the substrate 200, and may control a transfer rate of heat during a crystallization process for forming the first and second active patterns 210a and 210b. For example, the buffer layer 205 may include silicon oxide ($SiO_x$), silicon nitride ($SiN_x$), silicon oxynitride ($SiO_xN_y$), etc. Here, the buffer layer 205 may have a single layer structure or a multi-layer structure. Alternatively, the buffer layer 205 may be omitted.

The first active pattern 210a and the second active pattern 210b may be disposed on the buffer layer 205. Each of the first and second active patterns 210a and 210b may include a silicon compound or a polysilicon. A source region and a drain region may be disposed at both sides of the first active pattern 210a, and each of the source region and the drain region may include impurities. In addition, the second active pattern 210b may include impurities, and the impurities may be distributed around the second active pattern 210b. In some example embodiments, each of the first and second active patterns 210a and 210b may include oxide semiconductor, e.g., indium-gallium-zinc oxide (IGZO), zinc-tin oxide (ZTO) or indium-tin-zinc oxide (ITZO).

A gate insulation layer 215 may be disposed on the buffer layer 205 to substantially cover the first and second active patterns 210a and 210b. The gate insulation layer 215 may extend from the display region 110 to the peripheral region 120. For example, the gate insulation layer 215 may include silicon oxide ($SiO_x$), silicon nitride ($SiN_x$), silicon oxynitride ($SiO_xN_y$), etc. Here, the gate insulation layer 215 may have a single layer structure or a multi-layer structure.

The first gate electrode 220a and the second gate electrode 220b may be disposed on the gate insulation layer 215 in the display region 110. The first gate electrode 220a and the second gate electrode 220b may be disposed over the first active pattern 210a and the second active pattern 210b, respectively. For example, each of the first and second gate electrodes 220a and 220b may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys thereof, or nitrides thereof. These may be used alone or in a combination thereof.

The first wiring 132 and the second wiring 142 may be disposed on the gate insulation layer 215 in the peripheral region 120. The first wiring 132 and the second wiring 142 may be spaced apart from each other at a predetermined distance, and may be disposed at substantially the same level over the substrate 200, e.g., at a same distance from a bottom surface of the substrate 200. Moreover, the first and second wirings 132 and 142 may be disposed at substantially the same level as the first and second gate electrodes 220a and 220b over the substrate 200, e.g., the first and second wirings 132 and 142 may be directly on a same element as the first and second gate electrodes 220a and 220b. In example embodiments, the first and second wirings 132 and 142 may include substantially the same material as the first and second gate electrodes 220a and 220b.

An insulation interlayer 235 may be disposed on the gate insulation layer 215 in the display region 110 to substantially cover the first and second gate electrodes 220a and 220b. For example, the insulation interlayer 235 may include silicon oxide ($SiO_x$), silicon nitride ($SiN_x$), silicon oxynitride ($SiO_xN_y$), etc. Here, the insulation interlayer 235 may have a single layer structure or a multi-layer structure.

The source electrode 240 and the drain electrode 245 may be disposed on the insulation interlayer 235. Each of the source electrode 240 and the drain electrode 245 may pass through the insulation interlayer 235 and the gate insulation layer 215 to contact the first active pattern 210a. For example, each of the source electrode 240 and the drain electrode 245 may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys thereof, or nitrides thereof. These may be used alone or in a combination thereof.

In example embodiments, the driving transistor may include the first active pattern 210a, the gate insulation layer 215, the first gate electrode 220a, the source electrode 240, and the drain electrode 245, and the capacitor 320 may include the second active pattern 210b, the gate insulation layer 215, and the second gate electrode 220b.

An insulation layer 250 may be disposed on the insulation interlayer 235. The insulation layer 250 may substantially cover the source electrode 240 and the drain electrode 245. A via structure for electrically connecting the pixel electrode 260 and the drain electrode 245 may be provided in the insulation layer 250. In example embodiments, a contact hole exposing a portion of the drain electrode 245 may be provided in the insulation layer 250, and the pixel electrode 260 may fill the contact hole to contact the drain electrode 245. In other example embodiments, a contact including a conductive material may be provided in the contact hole, and the pixel electrode 260 and the drain electrode 245 may contact a top portion and a bottom portion of the contact, respectively. The insulation layer 250 may substantially serve as a planarization layer for upper structures. For example, the insulation layer 250 may include an organic material, e.g., polyimide, epoxy-based resin, acryl-based resin, polyester, or the like.

The insulation layer 250 may be disposed in the display region 110. However, the insulation layer 250 may not be disposed in the third sub-region 126 of FIG. 3. Therefore, a path for vapor or oxygen to move from outside to elements in the display region 110 may be blocked.

The pixel electrode 260 may be disposed on the insulation layer 250. As discussed previously, the pixel electrode 260 may fill the contact hole to contact the drain electrode 245, or the pixel electrode 260 may be electrically connected to the drain electrode 245 through the contact provided in the contact hole. For example, the pixel electrode 260 may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), or alloys thereof. Alternatively, the pixel electrode 260 may include a transparent conductive material. In example embodiments, the pixel electrode 260 may be individually disposed per each pixel.

A pixel defining layer 270 may be disposed in the display region 110, and may not be disposed in the third sub-region 126. Therefore, a path for vapor or oxygen to move from outside to elements in the display region 110 may be blocked.

The organic light-emitting layer 280 may be disposed on the pixel electrode 260. The organic light-emitting layer 280 may include a host material excited by holes and electrons, and a dopant material for facilitating an absorbance and a release of energy and improving a light-emitting efficiency. Alternatively, the organic light-emitting structure 330 may further include a hole transport layer (HTL) interposed between the pixel electrode 260 and the organic light-emitting layer 280. The organic light-emitting structure 330 may further include an electron transport layer (ETL) interposed between the common electrode 290 and the organic light-emitting layer 280.

The common electrode 290 may be disposed on the organic light-emitting layer 280 and on the pixel defining layer 270. The common electrode 290 may face the pixel electrode 260 with respect to the organic light-emitting layer 280. For example, the common electrode 290 may include a metal having a relatively low work function, e.g., aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), or alloys thereof. In example embodiments, the pixel electrode 260 and the common electrode 290 may be provided as an anode and a cathode of the organic light-emitting structure 330, respectively.

The encapsulation layer 150 may substantially cover an entirety of the display region 110 and the peripheral region 120 over the substrate 200. In example embodiments, the encapsulation layer 150 may be disposed on the common electrode 290 in the display region 110, and may be disposed over the first and second wirings 132 and 142 in the peripheral region 120. Here, as illustrated in a portion 'Y' in FIG. 4, the encapsulation layer 150 may have a stepped region along a profile of the first and second wirings 132 and 142. If the encapsulation layer 150 were to be directly located on a top surface and a sidewall of each of the first and second wirings 132 and 142, damage (e.g., a crack) could occur in the stepped region of the encapsulation layer 150, so that properties of the organic light-emitting display device 100 could be decreased.

Therefore, according to embodiments, the compensation layer 160 is disposed between the first and second wirings 132 and 142, and the encapsulation layer 150, and may surround the top surface and the sidewall of each of the first and second wirings 132 and 142. In other words, the compensation layer 160 may, e.g., conformally, cover the top surface and the sidewall of each of the first and second wirings 132 and 142, e.g., to reduce a height of a stepped region formed by the first and second wirings 132 and 142. Therefore, the compensation layer 160 may compensate a stepped region derived from the first and second wirings 132 and 142, so damage (e.g., a crack) on the encapsulation layer 150 may be prevented.

In detail, the compensation layer 160 may be disposed on the gate insulation layer 215 in the peripheral region 120. In example embodiments, the compensation layer 160 and the insulation interlayer 235 may be disposed at substantially the same level over the substrate 200. In other words, the insulation interlayer 235 may extend, e.g., continuously, from the display region 110 to the peripheral region 120, and may serve as the compensation layer 160 on the top surface and the sidewall of each of the first and second wirings 132 and 142 in the peripheral region 120. Here, the compensation layer 160 may include substantially the same material as the insulation interlayer 235, e.g., the compensation layer 160 and the insulation interlayer 235 may be parts of a same layer. The compensation layer 160 may be disposed between the first and second wirings 132 and 142, and the encapsulation layer 150, so that the compensation layer 160 may compensate the stepped region derived from the first and second wirings 132 and 142, and damage (e.g., a crack) on the encapsulation layer 150 may be prevented.

Figure 5:
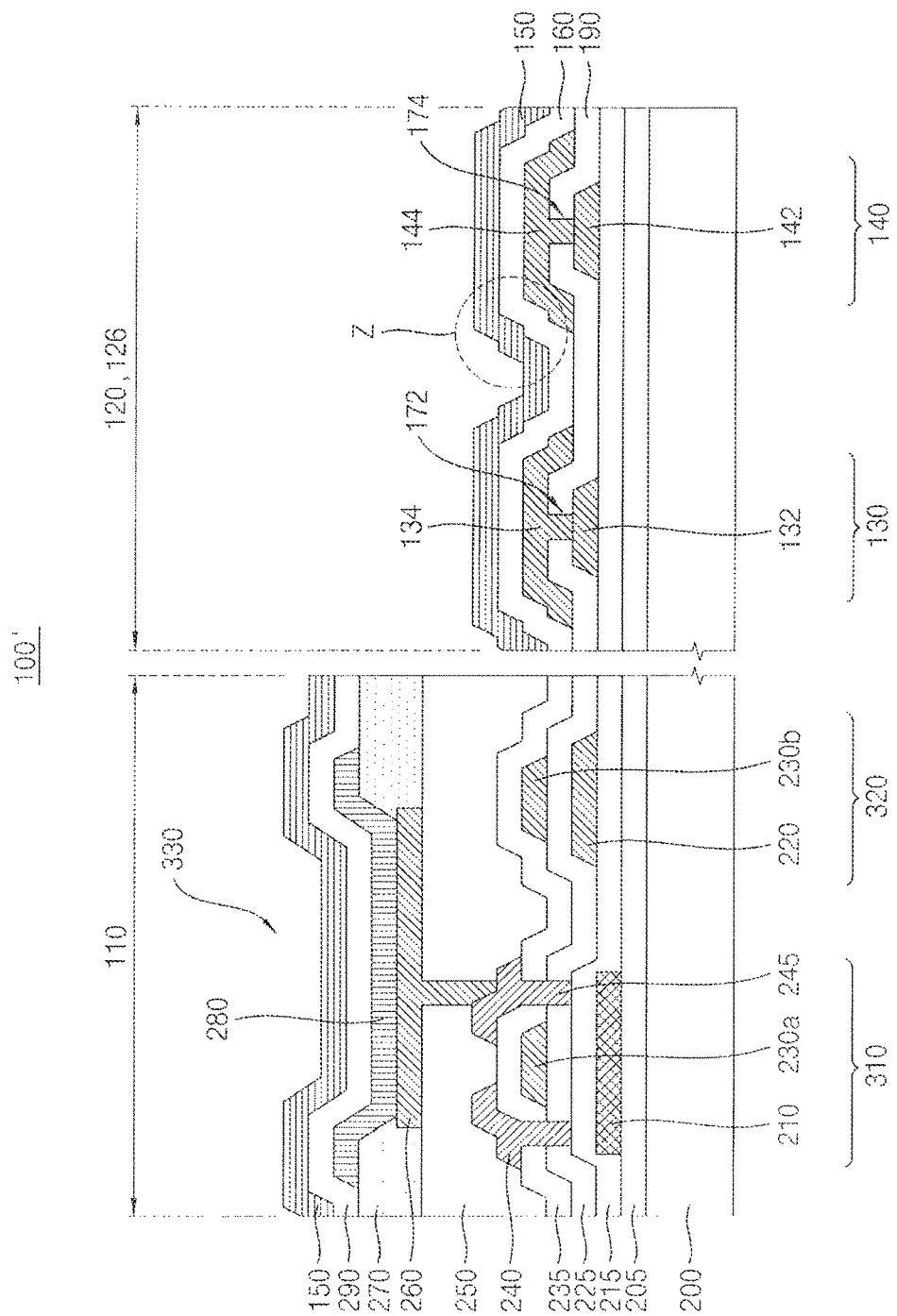
FIG. 5 illustrates a cross-sectional view along line I-I' of FIG. 1 in accordance with other example embodiments.

FIG. 5 is a cross-sectional view illustrating a cross-sectional view taken along line I-I' in FIG. 1 in accordance with other embodiments.

Referring to FIG. 5, an organic light-emitting display device 100' may include the substrate 200, the pixel circuit, the first wiring part 130, the second wiring part 140, the compensation layer 160, the organic light-emitting structure 330, the encapsulation layer 150, etc. In example embodiments, the first wiring part 130 may include the first wiring 132 and a third wiring 134, and the second wiring part 140 may include the second wiring 142 and a fourth wiring 144. The organic light-emitting structure 330 may include the pixel electrode 260, the organic light-emitting layer 280 and the common electrode 290, etc. Detailed description of elements in FIG. 5 which are substantially the same as or similar to those described previously with reference to FIG. 4 will not be repeated.

The pixel circuit may include the driving transistor 310 and the capacitor 320. The pixel circuit may further include the switching transistor, however, the switching transistor is not illustrated in FIG. 5 for convenience of illustration. For example, each of the driving transistor 310 and the switching transistor may correspond to a thin film transistor. The driving transistor 310 may include an active pattern 210, a second gate electrode 230a, the source electrode 240, and the drain electrode 245. The capacitor 320 may include a first gate electrode 220 and a third gate electrode 230b.

The first gate electrode 220 may be disposed on the gate insulation 215 in the display region 110. For example, the first gate electrode 220 may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys thereof, or nitrides thereof. These may be used alone or in a combination thereof.

The first wiring 132 and the second wiring 142 may be disposed on the gate insulation layer 215 in the peripheral region 120. The first wiring 132 and the second wiring 142 may be spaced apart from each other at a predetermined distance, and may be disposed at substantially the same level over the substrate 200. Moreover, the first and second wirings 132 and 142 may be disposed at substantially the same level as the first gate electrode 220 over the substrate 200. In example embodiments, the first and second wirings 132 and 142 may include substantially the same material as the first gate electrode 220.

A second gate insulation layer 225 may be disposed on the first gate insulation layer 215 in the display region 110 to substantially cover the first gate electrode 220. The second gate insulation layer 225 may insulate the first gate electrode 220 and the third gate electrode 230b which are electrodes of the capacitor 320. For example, the second gate insulation layer 225 may include silicon oxide ($SiO_x$), silicon nitride ($SiN_x$), silicon oxynitride ($SiO_xN_y$), etc. Here, the second gate insulation layer 225 may have a single layer structure or a multi-layer structure.

An interwiring insulation layer 190 may be disposed on the first gate insulation layer 215 in the peripheral region 120 to substantially surround a top surface and a sidewall of each of the first and second wirings 132 and 142. In example embodiments, the second gate insulation layer 225 and the interwiring insulation layer 190 may be disposed at substantially the same level over the substrate 200. In other words, the second gate insulation layer 225 may extend from the display region 110 to the peripheral region 120, and may serve as the interwiring insulation layer 190 substantially surrounding the top surface and the sidewall of each of the first and second wirings 132 and 142 in the peripheral region 120. Here, the interwiring insulation layer 190 may include substantially the same material as the second gate insulation layer 225, e.g., the interwiring insulation layer 190 and the second gate insulation layer 225 may be parts of a same layer.

The second gate electrode 230a and the third gate electrode 230b may be disposed on the second gate insulation layer 215. The second gate electrode 230a and the third gate electrode 230b may be disposed over the active pattern 210 and the first gate electrode 220, respectively. For example, each of the second and third gate electrodes 230a and 230b may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), alloys thereof, or nitrides thereof. These may be used alone or in a combination thereof.

In example embodiments, the third wiring 134 and the fourth wiring 144 may be disposed on the interwiring insulation layer 190. The third wiring 134 and the fourth wiring 144 may substantially overlap the first wiring 132 and the second wiring 142, respectively. The third wiring 134 and the fourth wiring 144 may be spaced apart from each other at a predetermined distance, and may be disposed at substantially the same level over the substrate 200. Moreover, the third and fourth wirings 134 and 144 may be disposed at substantially the same level as the second and third gate electrodes 230a and 230b over the substrate 200. In example embodiments, the third and fourth wirings 134 and 144 may include substantially the same material as the second and third gate electrodes 230a and 230b.

The third wiring 134 may be electrically connected to the first wiring 132, and the fourth wiring 144 may be electrically connected to the second wiring 142. In example embodiments, the third and fourth wirings 134 and 144 may contact the first and second wirings 132 and 142, respectively, through contact holes 172 and 174. More specifically, a first contact hole 172 exposing the first wiring 132 and a second contact hole 174 exposing the second wiring 142 may be provided in the interwiring insulation layer 190. The third wiring 134 may fill the first contact hole 172 to contact the first wiring 132, and the fourth wiring 144 may fill the second contact hole 174 to contact the second wiring 142. Therefore, a resistance of each of the first wiring part 130 and the second wiring part 140 may be decreased.

The compensation layer 160 may be disposed between the third and fourth wirings 134 and 144, and the encapsulation layer 150, and may surround the top surface and the sidewall of each of the third and fourth wirings 134 and 144. The compensation layer 160 may be disposed on the interwiring insulation layer 190 in the peripheral region 120. In example embodiments, the compensation layer 160 and the insulation interlayer 235 may be disposed at substantially the same level over the substrate 200. In other words, the insulation interlayer 235 may extend from the display region 110 to the peripheral region 120, and may serve as the compensation layer 160 substantially surrounding the top surface and the sidewall of each of the third and fourth wirings 134 and 144 in the peripheral region 120. The compensation layer 160 may compensate the stepped region derived from the third and fourth wirings 134 and 144. Here, the compensation layer 160 may include substantially the same material as the insulation interlayer 235.

The compensation layer 160 may be disposed between the third and fourth wirings 134 and 144, and the encapsulation layer 150, so that the compensation layer 160 may compensate the stepped region derived from the third and fourth wirings 134 and 144 as illustrated in a portion 'Z' in FIG. 5, and damage (e.g., a crack) on the encapsulation layer 150 may be prevented.

The organic light-emitting display device according to example embodiments may be applied to various electronic devices. For example, the organic light-emitting display devices may be applied to computers, notebooks, mobile phones, smart phones, smart pads, personal media players, personal digital assistants, MP3 players, digital cameras, video camcorders, etc.

By way of summation and review, power voltage wirings including metal may be located in a peripheral region of the organic light-emitting display device. When the encapsulation layer is disposed on and directly contacts the power voltage wirings, the encapsulation layer may be damaged or cracked due to stress generated from the power voltage wirings.

In contrast, example embodiments provide an organic light-emitting display device including a compensation layer that compensates for a stepped region derived from wirings. That is, according to example embodiments, the organic light-emitting display device may include the compensation layer disposed between the first and second wirings, and the encapsulation layer, so that the stepped region derived from the first and second wirings may be substantially compensated, and damage (e.g., crack) to the encapsulation layer may be prevented. Furthermore, the organic light-emitting display device may further include the third and fourth wirings electrically connected to the first and second wirings, respectively, such that electrical resistance of the first and second wirings may be decreased, and electrical properties of the organic light-emitting display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting display device, comprising:
a substrate having a display region and a peripheral region;
a plurality of pixels on the substrate in the display region;
a first wiring on the substrate in the peripheral region;
a first insulation layer partially covering a top surface and a sidewall of the first wiring;
a second wiring on the first insulation layer, the second wiring being electrically connected to the first wiring;
a second insulation layer on the second wiring, the second insulation layer covering a top surface and a sidewall of the second wiring; and
an encapsulation layer including a plurality of stacked layers, the encapsulation layer encapsulating the plurality of pixels and extending from the display region to the peripheral region on the second insulation layer, wherein
the second insulation layer is disposed between the second wiring and a lowermost inorganic layer of the plurality of stacked layers, and
a first portion of the second insulation layer contacts the first insulation layer.

2. The light-emitting display device as claimed in claim 1, wherein the first insulation layer is formed along a profile of the first wiring.

3. The light-emitting display device as claimed in claim 1, wherein the second insulation layer is formed along a profile of the second wiring.

4. The light-emitting display device as claimed in claim 1, further comprising a conductive layer on the second insulation layer.

5. The light-emitting display device as claimed in claim 4, wherein a second portion of the second insulation layer contacts the conductive layer.

6. The light-emitting display device as claimed in claim 4, further comprising a planarization layer disposed in the display region and on the conductive layer, the planarization layer being absent from a portion of the peripheral region adjacent to the display region.

7. The light-emitting display device as claimed in claim 1, wherein the encapsulation layer is at least partially directly on the second insulation layer in the peripheral region.

8. The light-emitting display device as claimed in claim 1, wherein the second insulation layer has a partially stepped shape in a cross-sectional view.

9. The light-emitting display device as claimed in claim 1, wherein
the first insulation layer has a first contact hole exposing the first wiring, and
the second wiring fills the first contact hole to contact the first wiring.

10. The light-emitting display device as claimed in claim 1, wherein each of the plurality of pixels includes:
a pixel circuit having an active pattern, a first gate electrode, a gate insulation layer, a second gate electrode, the second insulation layer, a source electrode, and a drain electrode; and
an organic light-emitting structure having a pixel electrode, an organic light-emitting layer, and a common electrode, the organic light-emitting structure being electrically connected to the pixel circuit.

11. The light-emitting display device as claimed in claim 10, wherein the first wiring and the first gate electrode are at a same level over the substrate.

12. The light-emitting display device as claimed in claim 10, wherein the second wiring and the second gate electrode are at a same level over the substrate.

13. The light-emitting display device as claimed in claim 10, wherein the first insulation layer and the gate insulation layer are at a same level over the substrate.

14. The light-emitting display device as claimed in claim 10, further comprising a conductive layer on the second insulation layer,
wherein the conductive layer includes the source electrode and the drain electrode.

15. The light-emitting display device as claimed in claim 1, wherein a portion of the second wiring is between the first insulation layer and the second insulation layer in a horizontal direction.

16. The light-emitting display device as claimed in claim 1, wherein the second insulation layer prevents a crack from occurring in the encapsulation layer due a stepped region caused by the first wiring and the second wiring.

17. The light-emitting display device as claimed in claim 1, wherein the second wiring overlaps the first wiring in a plan view.

* * * * *